United States Patent
Tsujita

(10) Patent No.: US 9,559,015 B2
(45) Date of Patent: Jan. 31, 2017

(54) METHOD OF FORMING A CONDUCTIVE LINE PATTERN IN FINFET SEMICONDUCTOR DEVICES

(71) Applicant: CANON KABUSHIKI KAISHA, Tokyo (JP)

(72) Inventor: Koichiro Tsujita, Takarazuka (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/046,868

(22) Filed: Feb. 18, 2016

(65) Prior Publication Data
US 2016/0260639 A1 Sep. 8, 2016

(30) Foreign Application Priority Data
Mar. 3, 2015 (JP) .................................. 2015-041773

(51) Int. Cl.
*H01L 21/8238* (2006.01)
*H01L 21/027* (2006.01)
*H01L 21/308* (2006.01)

(52) U.S. Cl.
CPC ... *H01L 21/823821* (2013.01); *H01L 21/0273* (2013.01); *H01L 21/3086* (2013.01)

(58) Field of Classification Search
CPC ............ H01L 29/785; H01L 27/10879; H01L 27/1211; H01L 27/0886; H01L 27/0924
See application file for complete search history.

(56) References Cited

U.S. PATENT DOCUMENTS 9,142,641 B1 * 9/2015 Lin ...................... H01L 29/6656
2010/0287518 A1 11/2010 Becker

* cited by examiner

*Primary Examiner* — Mohammad Choudhry
(74) *Attorney, Agent, or Firm* — Rossi, Kimms & McDowell LLP

(57) ABSTRACT

The present invention provides a formation method of forming, on a substrate, a fin pattern in which a plurality of linear fins are arrayed, the method comprising forming a resist pattern having a line-and-space shape on the substrate, wherein the substrate includes a first active region and a second active region adjacent to each other, and in the forming the resist pattern, the resist pattern is formed on the substrate such that an interval between a first fin and a second fin becomes wider than a pitch of the fins, the first fin being closest to a boundary of the first active region and the second active region out of the fins formed in the first active region, and the second fin being closest to the boundary out of the fins formed in the second active region.

10 Claims, 16 Drawing Sheets

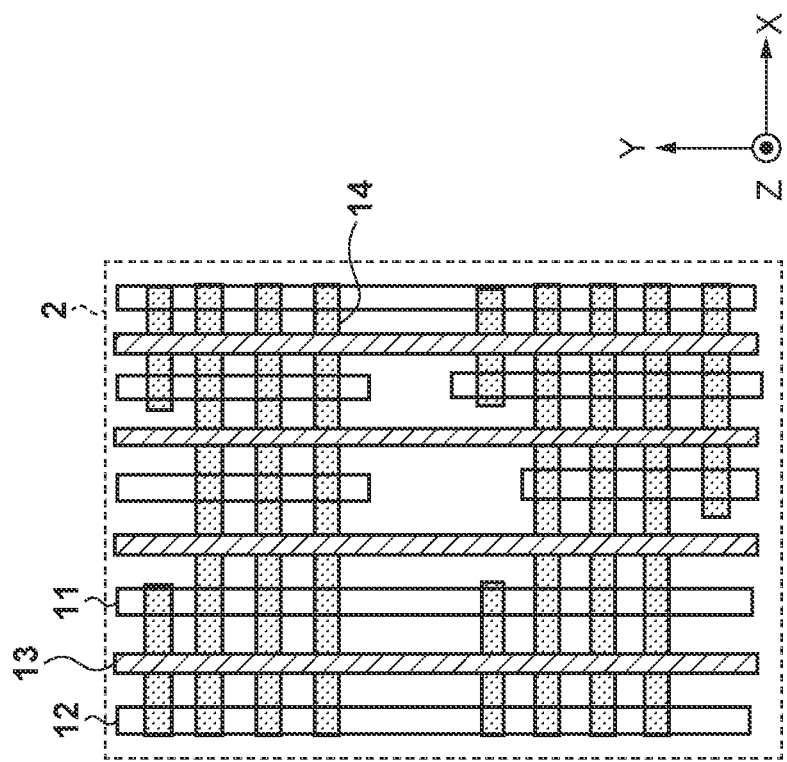
F I G. 3A
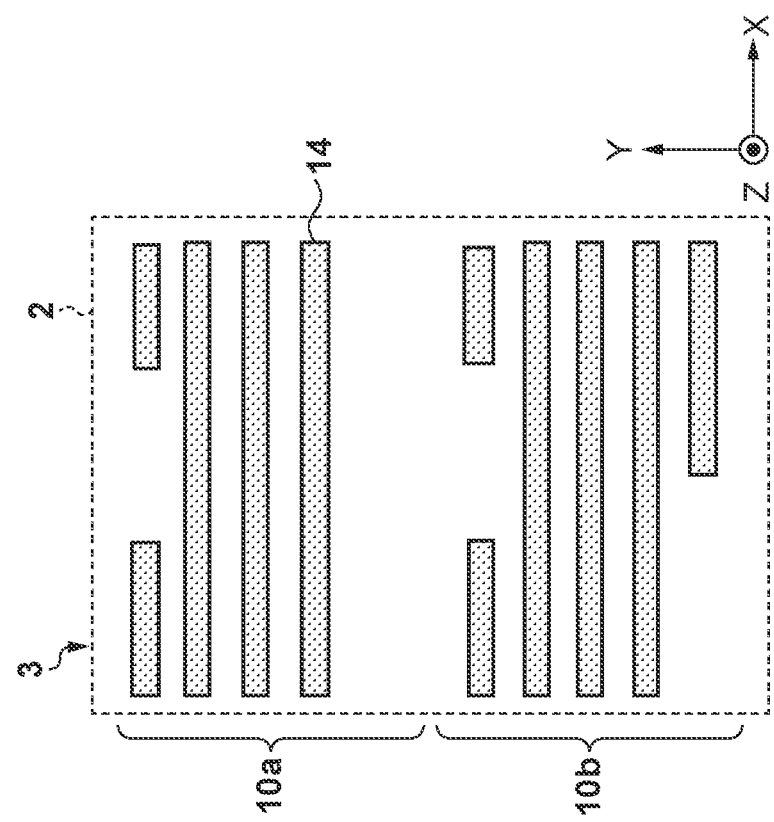
F I G. 3B

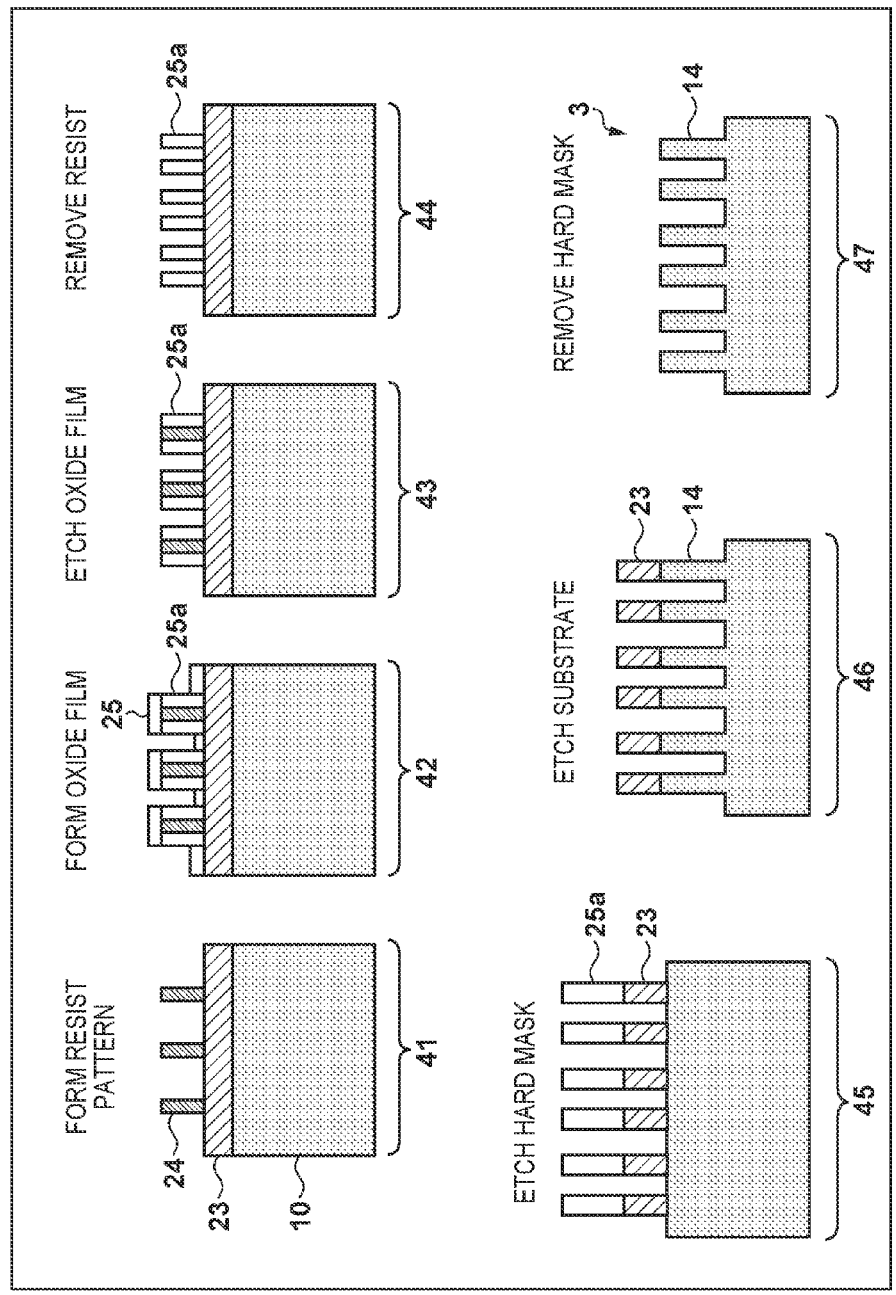

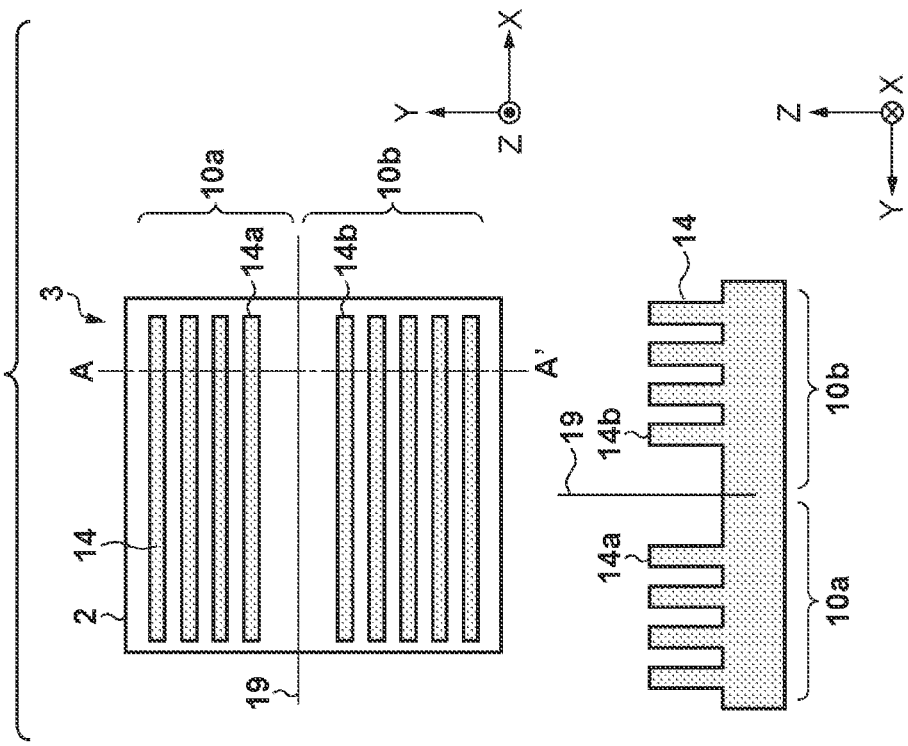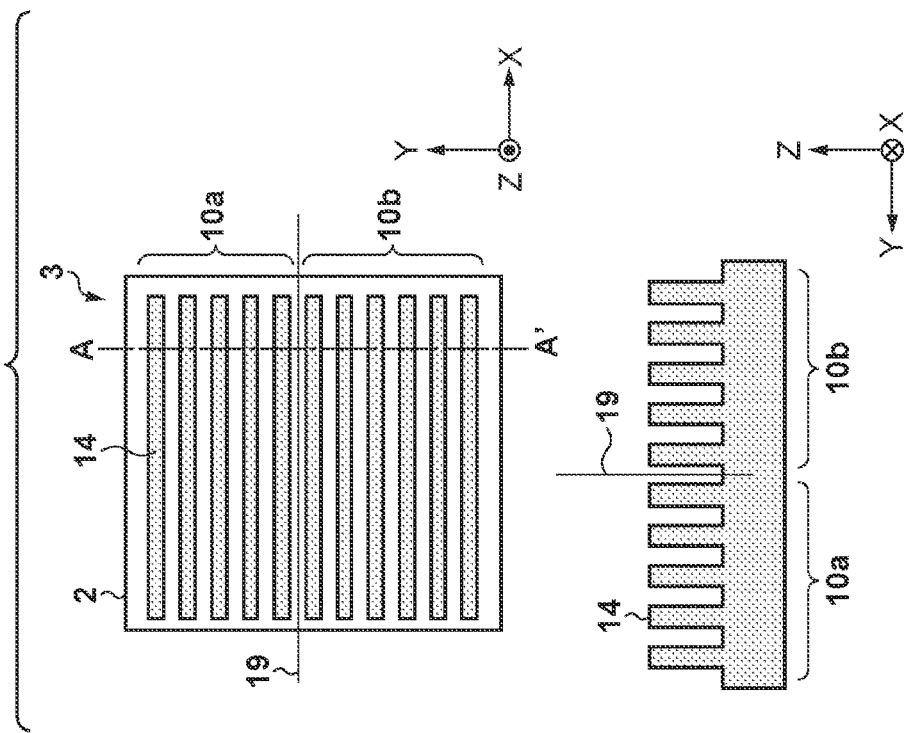

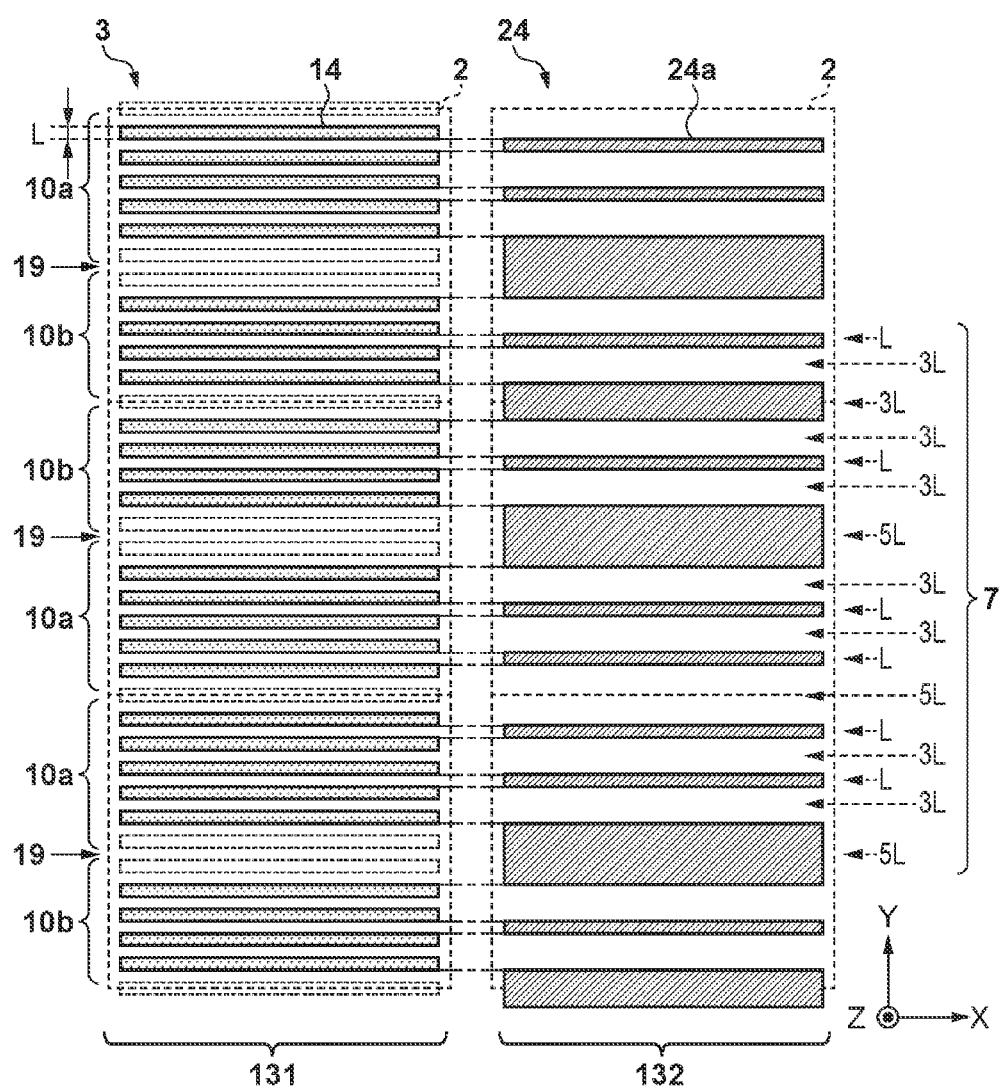
F I G. 13

METHOD OF FORMING A CONDUCTIVE LINE PATTERN IN FINFET SEMICONDUCTOR DEVICES

BACKGROUND OF THE INVENTION

Field of the Invention

The present invention relates to a formation method of forming, on a substrate, a fin pattern in which a plurality of fins are arrayed.

Description of the Related Art

The miniaturization of a transistor is required as the microfabrication of a circuit pattern of a semiconductor integrated circuit rises. However, if a gate length is shortened in order to achieve the miniaturization of the transistor, a drain leakage current may increase due to a short channel effect. To cope with this, there has been proposed a fin transistor which reduces the drain leakage current by a structure in which a channel portion is formed into a fin shape and the channel portion is sandwiched by a gate electrode. In a CMOS circuit using such a fin transistor, for example, a plurality of linear fins are formed on a substrate including an n-type active region and a p-type active region adjacent to each other, and a gate electrode common to the plurality of fins is provided (see U.S. Patent Application Publication No. 2010/287518).

In the fin formed at the boundary of the n-type active region and the p-type active region, a desired characteristic cannot be obtained when the fin is operated as the transistor. Therefore, the fin is not preferably formed at the boundary. In this case, it is desirable to fabricate a process of forming the plurality of fins on the substrate so as not to form the fin at the boundary of the n-type active region and the p-type active region.

SUMMARY OF THE INVENTION

The present invention provides a technique advantageous in, for example, forming a plurality of minute fins on a substrate easily.

According to one aspect of the present invention, there is provided a formation method of forming, on a substrate, a fin pattern in which a plurality of linear fins extending in a first direction are arrayed in a second direction different from the first direction, the method comprising: forming a resist pattern having a line-and-space shape on the substrate; forming a side wall in each of a plurality of line elements in the resist pattern; removing the resist pattern; and forming the fin pattern on the substrate by etching the substrate by using the side walls as etching masks, wherein the substrate includes a first active region and a second active region adjacent to each other in the second direction and different in a conductivity type, and in the forming the resist pattern, the resist pattern is formed on the substrate such that an interval between a first fin and a second fin becomes wider than a pitch of the fins formed in the first active region and a pitch of the fins formed in the second active region, the first fin being closest to a boundary of the first active region and the second active region out of the fins formed in the first active region, and the second fin being closest to the boundary out of the fins formed in the second active region.

Further features of the present invention will become apparent from the following description of exemplary embodiments with reference to the attached drawings.

BRIEF DESCRIPTION OF THE DRAWINGS

FIGS. 3A and 3B are views showing the arrangement of each standard cell;
FIG. 4 shows views for explaining a method of forming, on a substrate, a fin pattern in which a plurality of fins are arrayed;
FIGS. 5A and 5B are views for explaining the arrangement of the fin pattern;
FIG. 13 is a view showing an arrangement example of the fin pattern and the resist pattern.

DESCRIPTION OF THE EMBODIMENTS

Figure 1:
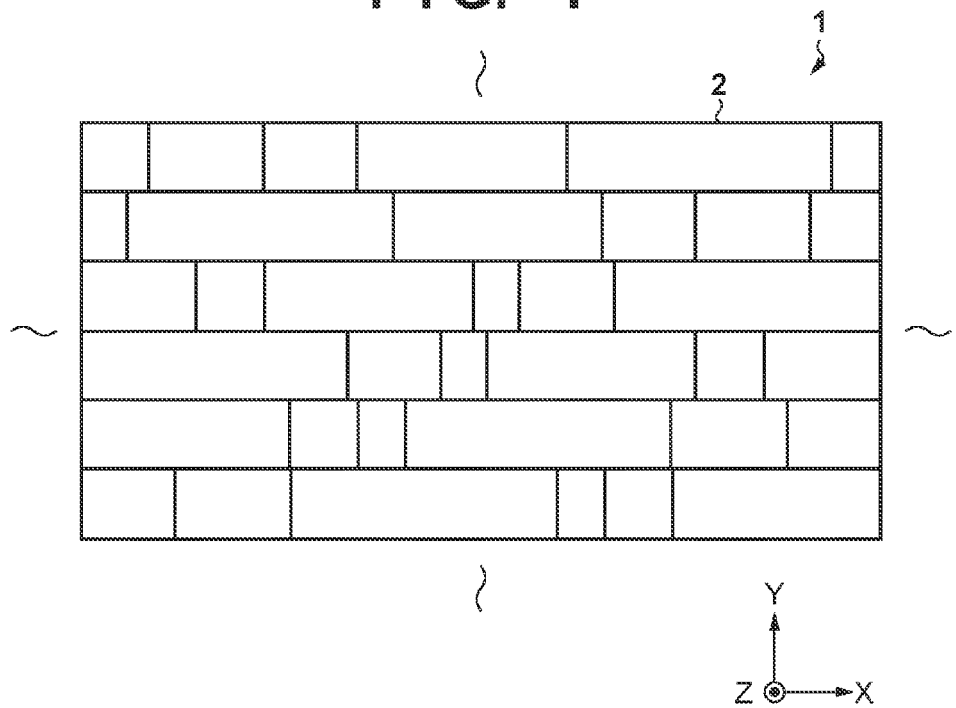
FIG. 1 is a view showing a logic circuit.

Exemplary embodiments of the present invention will be described below with reference to the accompanying drawings. Note that the same reference numerals denote the same members throughout the drawings, and a repetitive description thereof will not be given.

First Embodiment

A formation method of a fin pattern according to the present invention will be described. This embodiment can be used, for example, to fabricate a logic circuit. As shown in FIG. 1, a logic circuit 1 is formed by arranging a plurality of standard cells 2. Each standard cell 2 is made of, for example, a CMOS circuit. In each standard cell 2 on a substrate 10, the first active region and the second active region adjacent to each other and different in a conductivity type can be provided, and a gate electrode 13 common to the first active region and the second active region can be formed. For example, an n-type active region 10a and a p-type active region 10b, respectively, can be used as the first active region and the second active region. An example in which the n-type active region 10a is used as the first active region and the p-type active region 10b is used as the second active region will be described below.

Figure 2A:
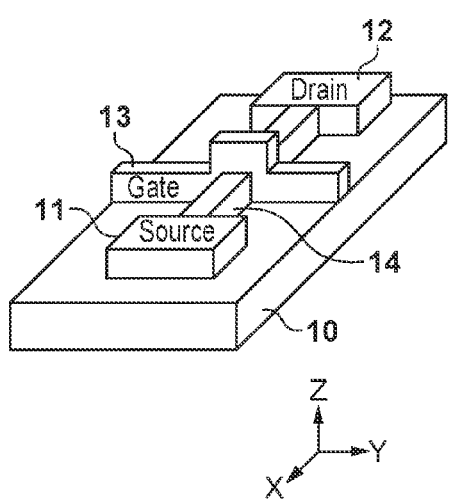
FIGS. 2A and 2B are views showing a fin transistor.
Figure 2B:
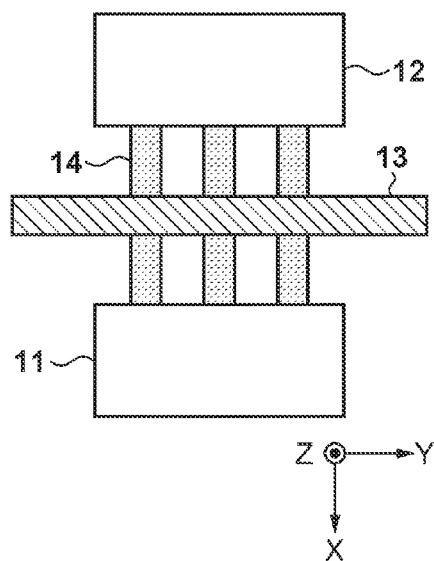

In recent years, the miniaturization of a transistor is required as the microfabrication of a circuit pattern of a semiconductor integrated circuit rises. In a planar transistor, however, if a gate length is shortened in order to achieve the miniaturization of the transistor, a drain leakage current may increase due to a short channel effect. To cope with this, a case increases in which a fin transistor is used, which reduces the drain leakage current by a structure, as shown in FIG. 2A, in which a channel portion is formed into a fin shape and the channel portion (fin 14) is sandwiched by the gate electrode 13. In such a fin transistor, the driving current of the transistor can be adjusted by the number of fins 14, as shown in FIG. 2B. Therefore, when using the fin transistor in each standard cell 2, a fin pattern 3 in which the plurality of fins 14 are arrayed can be formed on the substrate 10. In the fin pattern 3, the linear fins 14 extending in the first direction (for example, an X direction) are arrayed in the second direction (for example, a Y direction) different from the first direction, as shown in, for example, FIG. 3A. The n-type active region 10a and the p-type active region 10b of the substrate 10 are formed adjacent to each other in the second direction. After forming the fin pattern 3 on the substrate 10, the linear gate electrodes 13, drain electrodes 12, and source electrodes 11 extending in the second direction are formed in common with respect to the plurality of fins 14, as shown in FIG. 3B.

A method of forming the plurality of fins 14 on the substrate 10 will now be described. For example, in the CMOS circuit in 11-nm node logic, line and space (to be referred to as an L & S pattern hereinafter) in which each width and each interval of the fins 14 are 18 nm can be adopted. However, since the maximum NA (numerical aperture) of a projection optical system of an exposure apparatus using an ArF laser (wavelength of 193 nm) is 1.35, its resolution limit will be 36 nm (=0.25×(193 nm/1.35)) at a half pitch. That is, it is impossible to form, on the substrate 10, the fin pattern 3 in which the plurality of fins 14 each having a width of 35 nm or less which is shorter than the resolution limit are arrayed only by simply performing one exposure step, one development step, and one etching step. Therefore, the fin pattern 3 can be formed on the substrate 10 by, for example, a method shown in FIG. 4. FIG. 4 shows views for explaining the method of forming, on the substrate 10, the fin pattern 3 in which the plurality of fins 14 are arrayed. For example, the method of forming a pattern (line-and-space pattern) in which the plurality of fins (lines) each having a width of 20 nm are arrayed at intervals of 20 nm will be described here. In a description below, L/S=20/20 nm indicates a case in which each width and each interval (the width of a space) of fins 14 are 20 nm.

First, as shown in a step 41 of FIG. 4, a resist pattern 24 of L/S=20/60 nm is formed on a hard mask 23 formed on the substrate 10 (for example, a silicon substrate) (first step). The resist pattern 24 of L/S=20/60 nm can be fabricated by, for example, forming a provisional resist pattern of L/S=40/60 nm with the exposure apparatus, and then processing it (performing isotropic etching) by an oxygen plasma or the like. After the resist pattern 24 of L/S=20/60 nm is formed on the hard mask 23, an oxide film 25 is deposited by using CVD, sputtering, or the like, as shown in a step 42 of FIG. 4. The oxide film 25 is deposited such that its thickness becomes equal to the width of each fin 14 that should be formed on the substrate 10. That is, the oxide film 25 is deposited to have the thickness of 20 nm. Since the oxide film 25 is deposited isotropically, the thickness of the oxide film 25 (referred to as side walls 25a) formed on the side surface of a resist on the hard mask 23 also becomes 20 nm which is the same as the width of each fin 14 that should be formed on the substrate 10. The oxide film 25 is deposited here. However, since the oxide film 25 is used to etch the underlying hard mask 23, the present invention is not limited to the oxide film 25 and may be applied to, for example, a carbon film.

After the oxide film 25 is deposited on the resist pattern 24, the oxide film 25 undergoes anisotropic etching until the upper surface of the resist pattern 24 appears, as shown in a step 43 of FIG. 4. This makes it possible to form the side wall 25a made of the oxide film 25 for each of a plurality of line elements in the resist pattern 24 (second step). Then, as shown in a step 44 of FIG. 4, the resist pattern 24 is removed by using the oxygen plasma or the like (third step). On the hard mask 23 which has undergone this step, only the side walls 25a made of the oxide film 25 remain. This makes it possible to form a pattern of L/S=20/20 nm made by the oxide film 25. The substrate 10 is etched by using the side walls 25a thus made of the oxide film 25 as etching masks (fourth step). More specifically, the hard mask 23 undergoes anisotropic etching by using the side walls 25a as the etching masks, as shown in a step 45 of FIG. 4. Then, after the side walls 25a are removed, the substrate 10 undergoes anisotropic etching by using the hard mask 23 as an etching mask, as shown in a step 46 of FIG. 4. This makes it possible to form, on the substrate 10, the fin pattern 3 in which the plurality of fins 14 are arrayed, as shown in a step 47 of FIG. 4. This process increases a pattern density by self alignment, and is thus referred to as SADP (Self Align Double Patterning). The fin pattern 3 may be formed on the substrate 10 by applying SADP twice. A process of applying SADP twice is referred to as SAQP (Self Align Quadruple Patterning).

If the fin 14 is formed at a boundary 19 of the n-type active region 10a and the p-type active region 10b, a desired characteristic cannot be obtained in the fin 14 when it is operated as the transistor. That is, the CMOS circuit may not operate normally. It is therefore preferable not to arrange the fin 14 at the boundary 19. However, it is difficult to form, on the substrate 10, the plurality of fins 14 arrayed at the predetermined intervals so as not to arrange the fin 14 at the boundary 19 in terms of positional accuracy of the fins 14 formed on the substrate 10. For example, as shown in FIG. 5A, assume a case in which the plurality of fins 14 arrayed at the predetermined intervals are formed on the substrate 10 (each standard cell 2) so as not to arrange the fin 14 at the boundary 19 of the n-type active region 10a and the p-type active region 10b. Referring to FIG. 5A, the upper view is a plan view showing the standard cell 2 in which the plurality of fins 14 are formed and the lower view is a sectional view taken along A-A'. In this case, both of each width and each interval of the fins 14 are 18 nm in 11-nm node logic, and thus positional accuracy of the fins formed on the substrate 10 needs to fall within 9 nm (=18 nm/2). It is however difficult to form the fins 14 on the substrate 10 with positional accuracy of 9 nm in consideration of a process error or the like. It is therefore preferable to form, on the substrate 10, the fin pattern 3 having an arrangement in which the fin that may be arranged at the boundary 19 of the n-type active region 10a and the p-type active region 10b is excluded, as shown in FIG. 5B. Referring to FIG. 5B, the upper view is a plan view showing the standard cell 2 in which the fin is not formed at the boundary 19 and the lower view is a sectional view taken along A-A'.

As a method of forming, on the substrate 10, the fin pattern 3 having the arrangement in which the fin that may be arranged at the boundary 19 is excluded, there is, for example, a method of removing the fin formed at the boundary 19 by etching or the like after the plurality of fins arrayed at the predetermined intervals are formed on the substrate 10. In this method, however, the number of steps increases and a manufacturing cost may increase accordingly. To prevent this, in the first embodiment, the resist pattern 24 formed on the substrate in order to form the side walls 25a is formed on the substrate so as not to arrange the fin at the boundary 19 of the n-type active region 10a and the p-type active region 10b in the above-described first step. That is, in the first step (step 41), the resist pattern 24 is formed such that the interval between a fin 14a of the n-type active region 10a and a fin 14b of the p-type active region 10b becomes wider than each pitch of the fins in the n-type active region 10a and each pitch of the fins in the p-type active region 10b. The fin 14a (the first fin) is a fin closest to the boundary 19 out of the fins 14 formed in the n-type active region 10a. The fin 14b (the second fin) is a fin closest to the boundary 19 out of the fins 14 formed in the p-type active region 10b. It is also preferable to form the resist pattern 24 on the substrate so as not to arrange the fin at the boundary of the two standard cells 2 adjacent in the second direction.

The arrangement of the resist pattern 24 formed on the substrate will now be described. The resist pattern 24 can be made of line elements 24a of a plurality of types each having a width of an odd multiple of each interval of the fins 14 that should be formed in the n-type active region 10a or the p-type active region 10b. The resist pattern 24 is preferably formed so as to satisfy at least one of three conditions below:

(1) The width of each line element $24a_2$ for defining the interval between the fin 14a and the fin 14b formed on the substrate 10 is wider than the width of each line element $24a_1$ for defining the interval of the fins 14 that should be formed in the n-type active region 10a or the p-type active region 10b. At this time, the width of each line element $24a_2$ is preferably n times (n is an odd number equal to or larger than three) the width of each line element $24a_1$;

(2) The width of each line element $24a_1$ for defining the interval of the fins 14 that should be formed in the n-type active region 10a or the p-type active region 10b is equal to the width of each fin 14 that should be formed on the substrate 10; and (3) Each interval of the line elements 24a is m times (m is the odd number equal to or larger than three) the width of each fin 14 that should be formed on the substrate 10.

Figure 6:
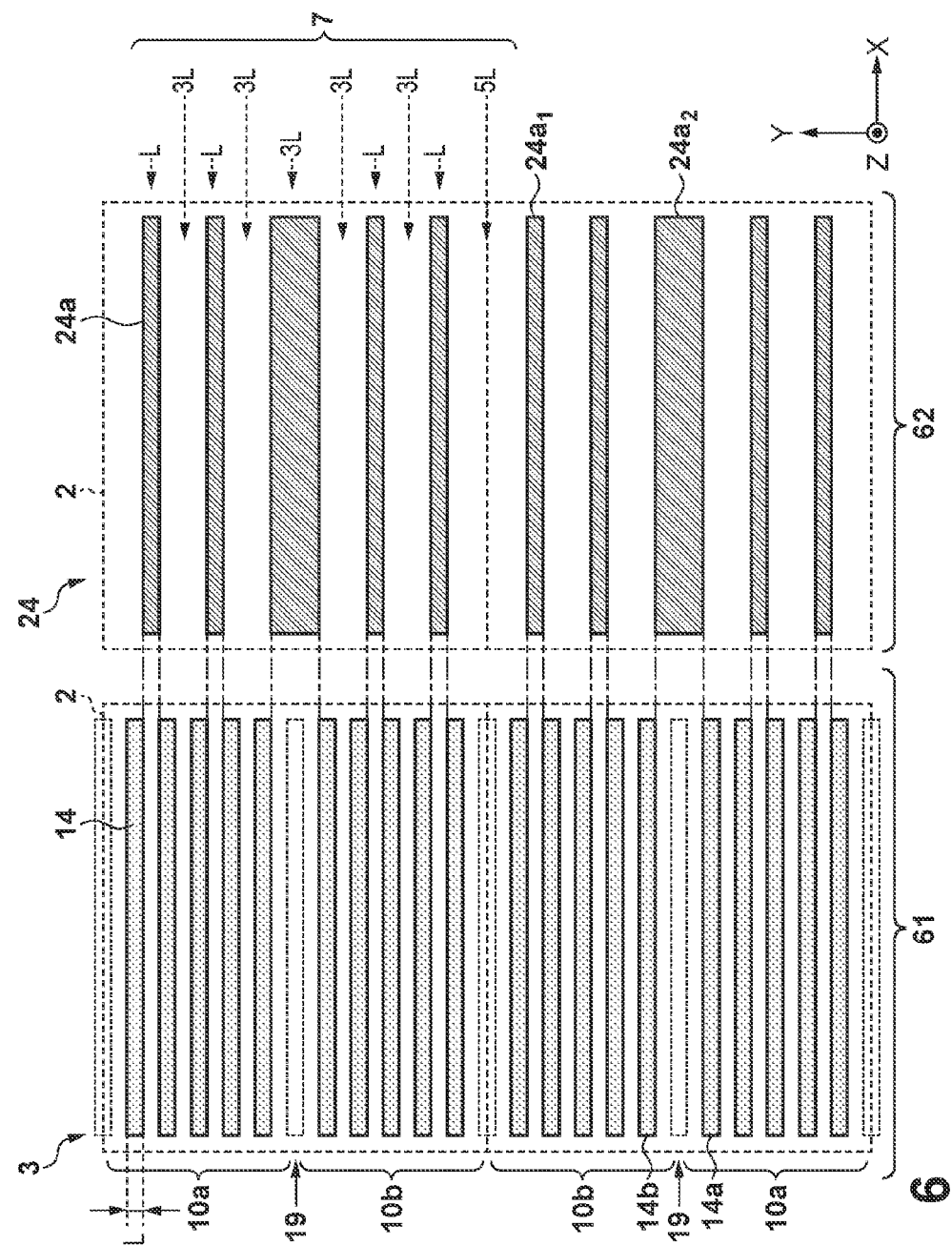
FIG. 6 is a view showing an arrangement example of the fin pattern and a resist pattern.

For example, as shown on a left side 61 of FIG. 6, assume a case in which the fin pattern 3 having an arrangement in which the five fins 14 are arranged in each of the n-type active region 10a and the p-type active region 10b, and the one fin that may be arranged at their boundary 19 is excluded is formed on the substrate 10. Each width and each interval of the fins 14 that should be formed in each of the n-type active region 10a and the p-type active region 10b have the same length L. The fin pattern 3 has the arrangement in which the one fin that may be arranged at the boundary of the two standard cells 2 adjacent in the second direction is excluded. Note that in the two standard cells 2 adjacent in the second direction, the arrangement of the n-type active region 10a and the p-type active region 10b is often inversed in order to share wiring. Therefore, FIG. 6 also shows the two standard cells 2 having the inversed arrangement of the n-type active region 10a and the p-type active region 10b.

In order to implement such an arrangement of the fin pattern 3, the resist pattern 24 shown on a right side 62 of FIG. 6 is preferably formed on the substrate. The resist pattern 24 shown on the right side 62 of FIG. 6 is formed such that the width of each line element $24a_1$ for defining the interval of the fins 14 in the n-type active region 10a or the p-type active region 10b becomes equal to the width of each fin 14 that should be formed on the substrate 10. The resist pattern 24 shown on the right side 62 of FIG. 6 is formed such that the width of each line element $24a_2$ for defining the interval between the fin 14a and the fin 14b formed on the substrate 10 becomes three times the width of each line element $24a_1$. The resist pattern 24 shown on the right side 62 of FIG. 6 is configured by the two types of intervals of the line elements 24a which are three times and five times the width of each fin 14 that should be formed on the substrate 10. In an example shown on the right side 62 of FIG. 6, the one standard cell 2 forms one pattern period 7.

Figure 7:
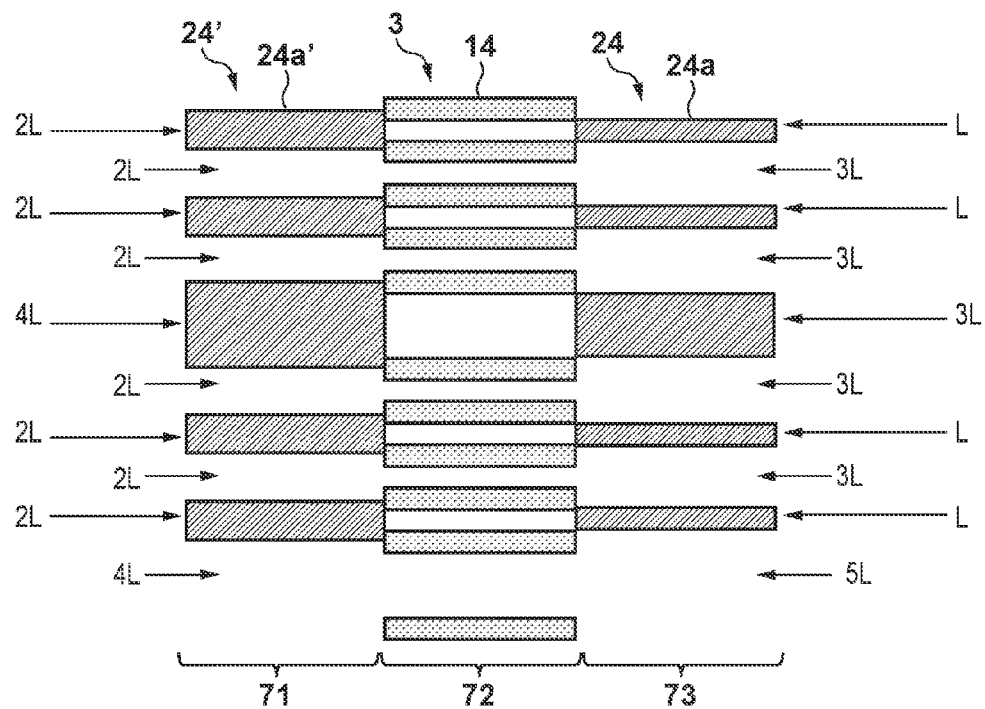
FIG. 7 is a view for explaining a formation method of the resist pattern.

The resolution limit of the exposure apparatus having the ArF laser is 36 nm at the half pitch, as described above. It is therefore difficult to form the resist pattern 24 (L=18 nm) shown on the right side 62 of FIG. 6 on the substrate directly. Therefore, when forming the resist pattern 24, for example, it is preferable to form, on the substrate, a provisional resist pattern 24' including line elements 24a' each having a width larger than the width of each line element 24a of the resist pattern 24 that should be formed on the substrate, as shown on a left side 71 of FIG. 7. At this time, each width and each interval of the line elements 24a' in the provisional resist pattern 24' are preferably equal to each other in order to improve an optical image by the exposure apparatus. After the provisional resist pattern 24' is formed on the substrate, the provisional resist pattern 24' is processed (for example, undergoes isotropic etching) by the oxygen plasma or the like, as shown on a right side 73 of FIG. 7. This makes it possible to form, on the substrate, the resist pattern 24 including the line elements 24a each having a width smaller than the resolution limit of the exposure apparatus. Note that a center 72 of FIG. 7 shows the fin pattern 3 that should be formed on the substrate 10.

Figure 8:
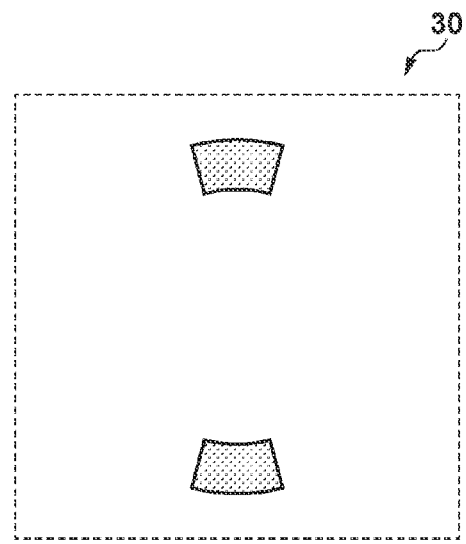
FIG. 8 is a view showing an illumination condition.

In a step of forming the provisional resist pattern 24' on the substrate by using the exposure apparatus, a transfer shift may be caused by non-periodicity of the pattern of an original (mask). It is therefore preferable that the pattern of the original is formed, based on the transfer shift, such that each line element 24a' is transferred to the target position of the substrate 10. An example of optimization of the pattern of the original will be described below. The image of the pattern of the original projected on the substrate 10 is obtained as an image obtained by performing convolution on the optical image at 15 nm when the exposure apparatus (NA=1.35) having the ArF laser, a 6% HT mask, and a dark field mask are used. Convolution is a method of obtaining one optical image by superimposing the optical image whose position is slightly moved on another. The positional distribution of the moved optical image is a Gaussian distribution and its width is 15 nm. This corresponds to considering acid diffusion of the resist. Dipole illumination 30 shown in FIG. 8 is used as an illumination condition.

Figure 9:
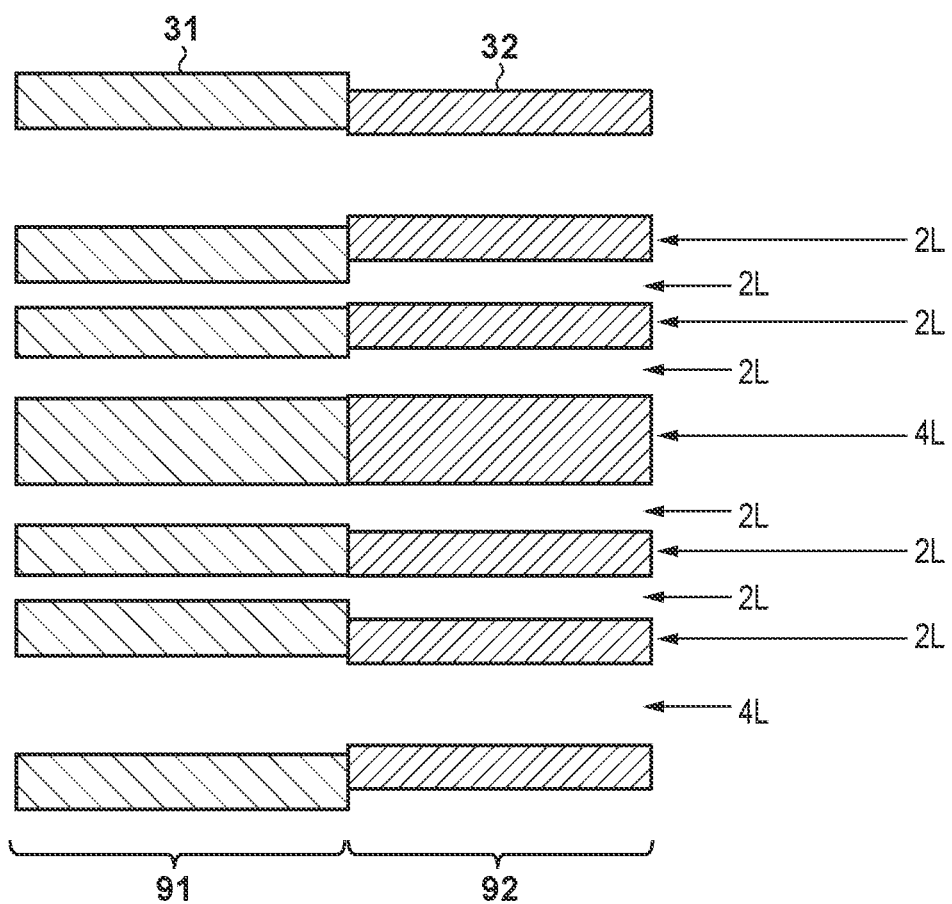
FIG. 9 is a view showing the positional relationship between a target pattern and an image of the pattern of an original.
Figure 10:
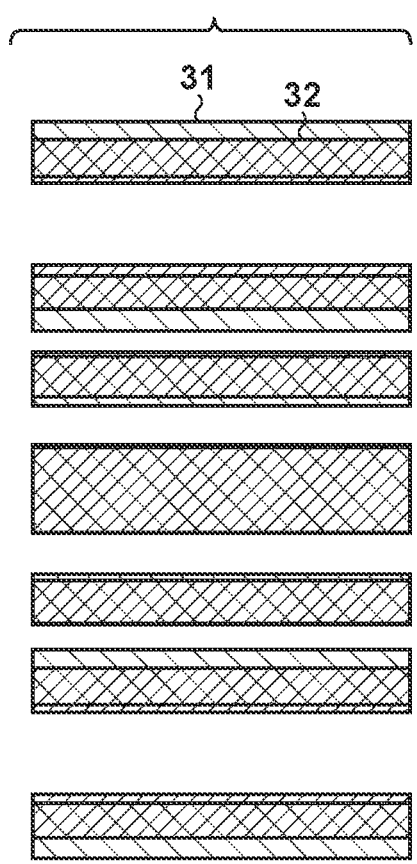
FIG. 10 is a view showing the positional relationship between the target pattern and the image of the pattern of the original.
Figure 11:
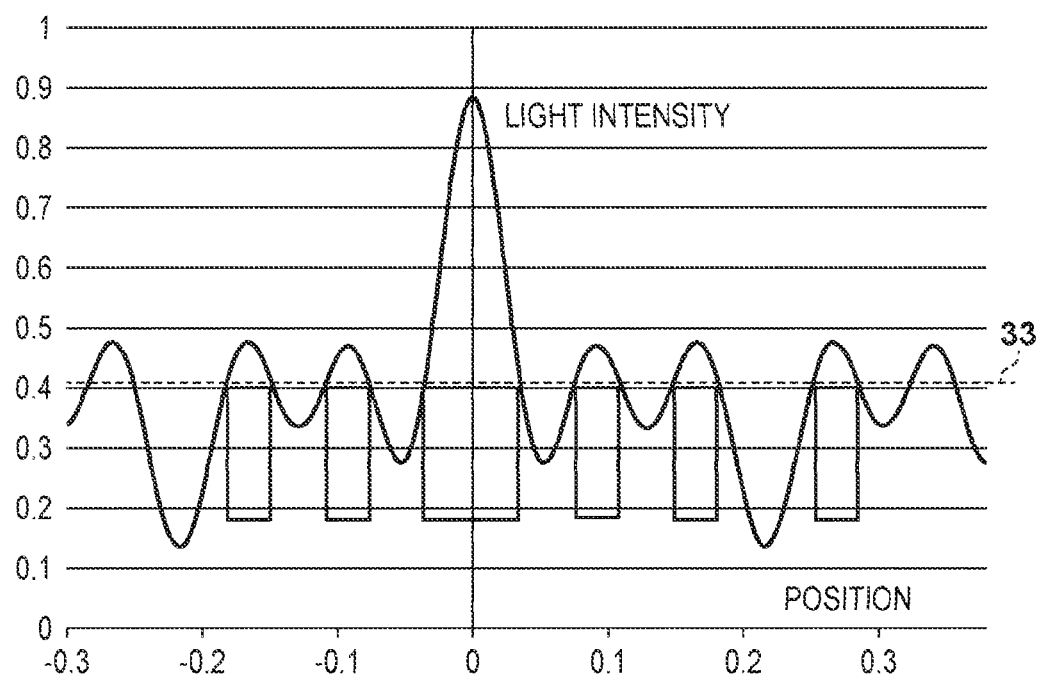
FIG. 11 is a graph showing the relationship between a light intensity and a position on the substrate in the second direction.

The provisional resist pattern 24' is formed in proximity to the resolution limit of the exposure apparatus. Therefore, the amount of the higher-order component of diffracted light from the original entering the pupil of the exposure apparatus decreases even if the pattern of the original is formed by the line-and-space pattern. Consequently, the image of the pattern of the original projected on the substrate is formed with a shift from the target position on the substrate by non-periodicity of the pattern of the original. That is, the transfer shift in the pattern of the original may occur. Each of FIGS. 9 and 10 shows the relationship between the image of the pattern of the original transferred onto the substrate and the target pattern (the pattern of the original) that should be transferred onto the substrate. A left side 91 of FIG. 9 shows an image 31 of the pattern of the original transferred onto the substrate 10. A right side 92 of FIG. 9 shows a target pattern 32 that should be transferred onto the substrate 10. FIG. 10 is a view obtained by overlaying the image 31 of the pattern of the original and the target pattern 32. FIG. 11 shows the relationship between a light intensity and a position on the substrate in the second direction. A dotted line 33 of FIG. 11 indicates the lower limit value of the light intensity for exposing the resist. The width of the waveform of the light intensity in the dotted line 33 becomes the resist pattern 24 (represented by a rectangle of FIG. 11). A NILS value which indicates the intensity gradient of the optical image on the dotted line 33 is 0.59. Note that the resist pattern 24 is a remaining pattern, and thus a negative resist is preferably used.

In the first embodiment, it is possible to form, on the substrate 10, the fin pattern 3 in which the plurality of fins 14 are arrayed, as shown on the left side 61 of FIG. 6, by forming the resist pattern 24 on the substrate as described above. After the fin pattern 3 is formed on the substrate 10, patterning is performed by the resist so as to expose the unwanted portion of each fin 14, and then the unwanted portion is removed by etching or the like. This makes it possible to form the plurality of fins 14 on the substrate in the pattern as shown in FIG. 3A.

Second Embodiment

In the first embodiment, the resist pattern 24 for implementing the fin pattern 3 having the arrangement in which the five fins 14 are arranged in each of the n-type active region 10a and the p-type active region 10b, and the one fin that may be arranged at the boundary 19 is excluded has been described. However, the present invention is not limited to this. The resist pattern 24 for implementing the fin pattern 3 having another arrangement can also be made of line elements 24a of the plurality of types each having the width of the odd multiple of each interval of the fins that should be formed in the n-type active region 10a or the p-type active region 10b. In the second embodiment, a resist pattern 24 for implementing a fin pattern 3 having another arrangement will be described. Such a resist pattern 24 can also be formed so as to satisfy at least one of the above-described three conditions.

The fin pattern 3 formed on a substrate 10 can be formed by the following combination:

(1) the number of fins 14 formed in an n-type active region 10a is an odd number or an even number;

(2) the number of fins 14 formed in a p-type active region 10b is the odd number or the even number; and (3) the number of fins to be excluded as a fin that may be arranged at a boundary 19 of the n-type active region 10a and the p-type active region 10b is one or two.

The fin pattern 3 to be shown below has an arrangement in which the one fin that may be arranged at the boundary of two standard cells 2 adjacent in the second direction is excluded. The interval of fins that should be formed in the n-type active region or the p-type active region has a length L which is equal to the width of each fin.

Figure 12:
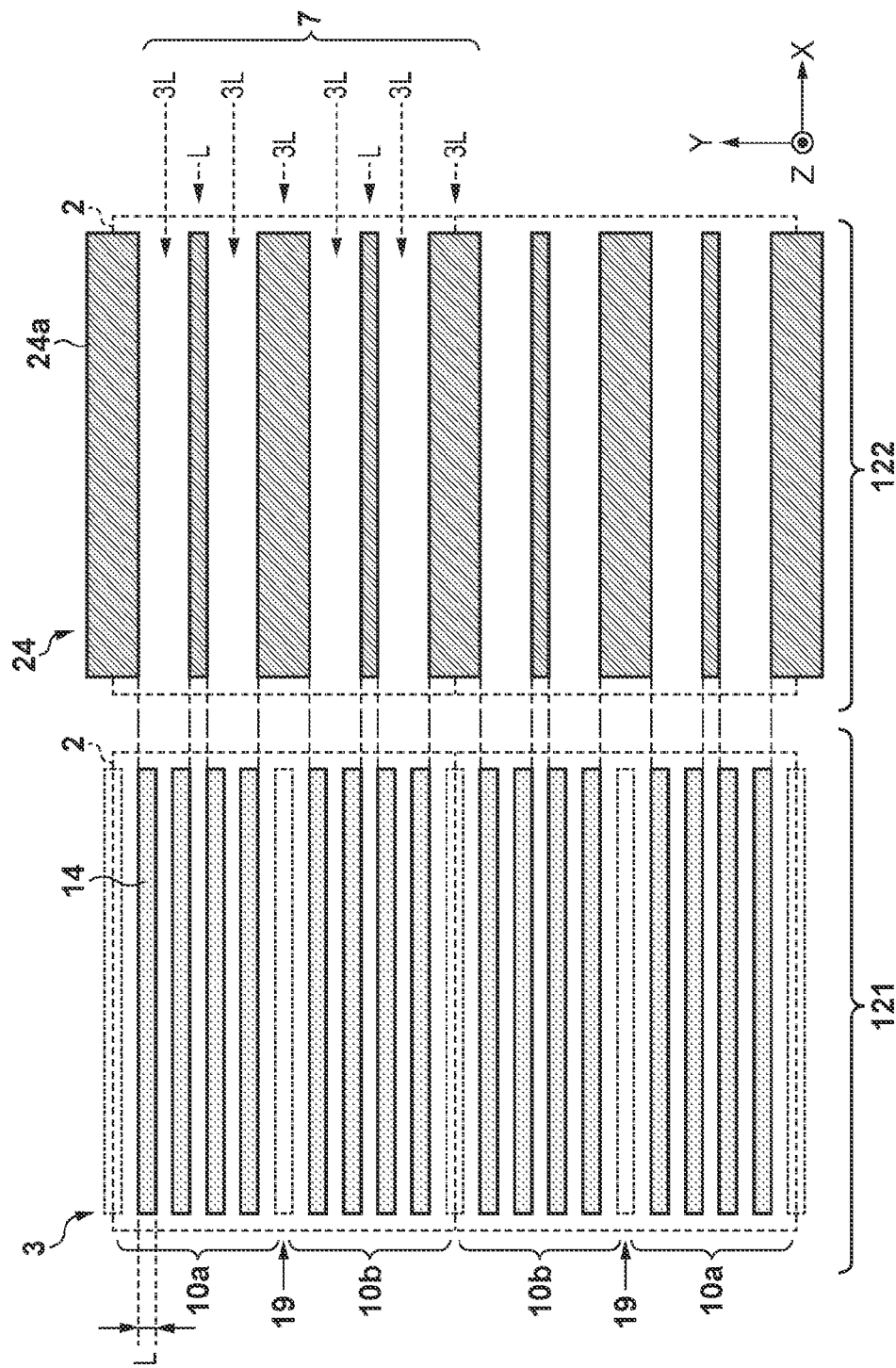
FIG. 12 is a view showing an arrangement example of a fin pattern and a resist pattern.

A left side 121 of FIG. 12 shows the fin pattern 3 having an arrangement in which the four fins 14 are arranged in each of the n-type active region 10a and the p-type active region 10b, and the one fin is excluded at their boundary 19. A right side 122 of FIG. 12 shows the resist pattern 24 formed on the substrate in order to implement the fin pattern 3 shown on the left side 121 of FIG. 12. The resist pattern 24 shown on the right side 122 of FIG. 12 can be made of line elements 24a each having the same width as the width of each fin 14 and the line elements 24a each having a width which is three times the width of each fin 14. Each interval of the line elements 24a can be configured to be three times the width of each fin 14.

A left side 131 of FIG. 13 shows the fin pattern 3 having an arrangement in which the five fins 14 for the n-type active region 10a and the four fins 14 for the p-type active region 10b are arranged, and the two fins are excluded at their boundary 19. On the left side 131 of FIG. 13, the two standard cells 2 form one pattern period 7. A right side 132 of FIG. 13 shows the resist pattern 24 formed on the substrate in order to implement the fin pattern 3 shown on the left side 131 of FIG. 13. The resist pattern 24 shown on the right side 132 of FIG. 13 can be made of the line elements 24a each having the same width as the width of each fin 14, the line elements 24a each having the width which is three times the width of each fin 14, and the line elements 24a each having a width which is five times the width of each fin 14. The intervals of the line elements 24a can be configured to be three times and five times the width of the fins 14.

Figure 14:
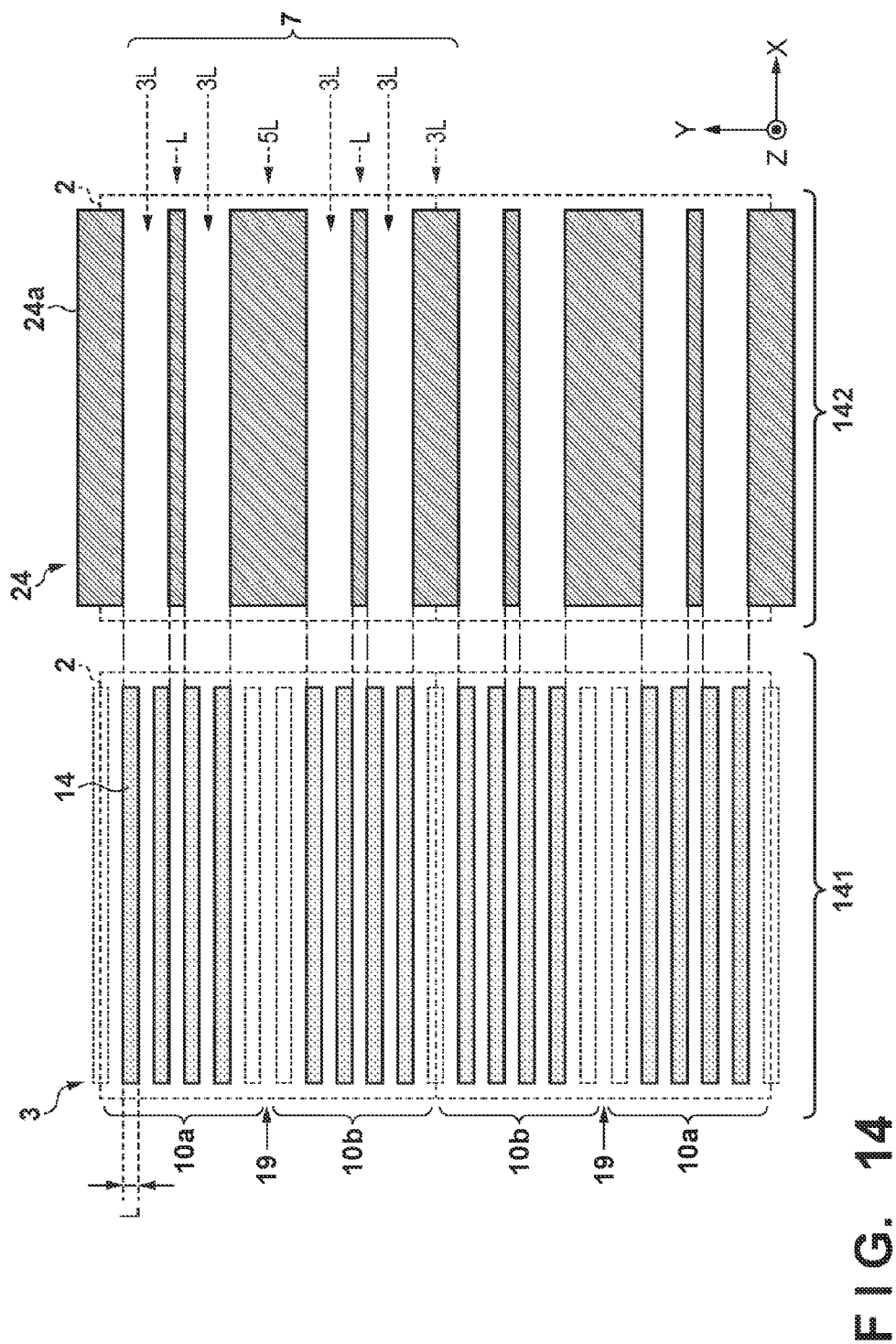
FIG. 14 is a view showing an arrangement example of the fin pattern and the resist pattern.

A left side 141 of FIG. 14 shows the fin pattern 3 having an arrangement in which the four fins 14 are arranged in each of the n-type active region 10a and the p-type active region 10b, and the two fins are excluded at their boundary 19. A right side 142 of FIG. 14 shows the resist pattern 24 formed on the substrate in order to implement the fin pattern 3 shown on the left side 141 of FIG. 14. The resist pattern 24 shown on the right side 142 of FIG. 14 can be made of the line elements 24a each having the same width as the width of each fin 14, the line elements 24a each having the width which is three times the width of each fin 14, and the line elements 24a each having the width which is five times the width of each fin 14. Each interval of the line elements 24a can be configured to be three times the width of each fin 14.

Figure 15:
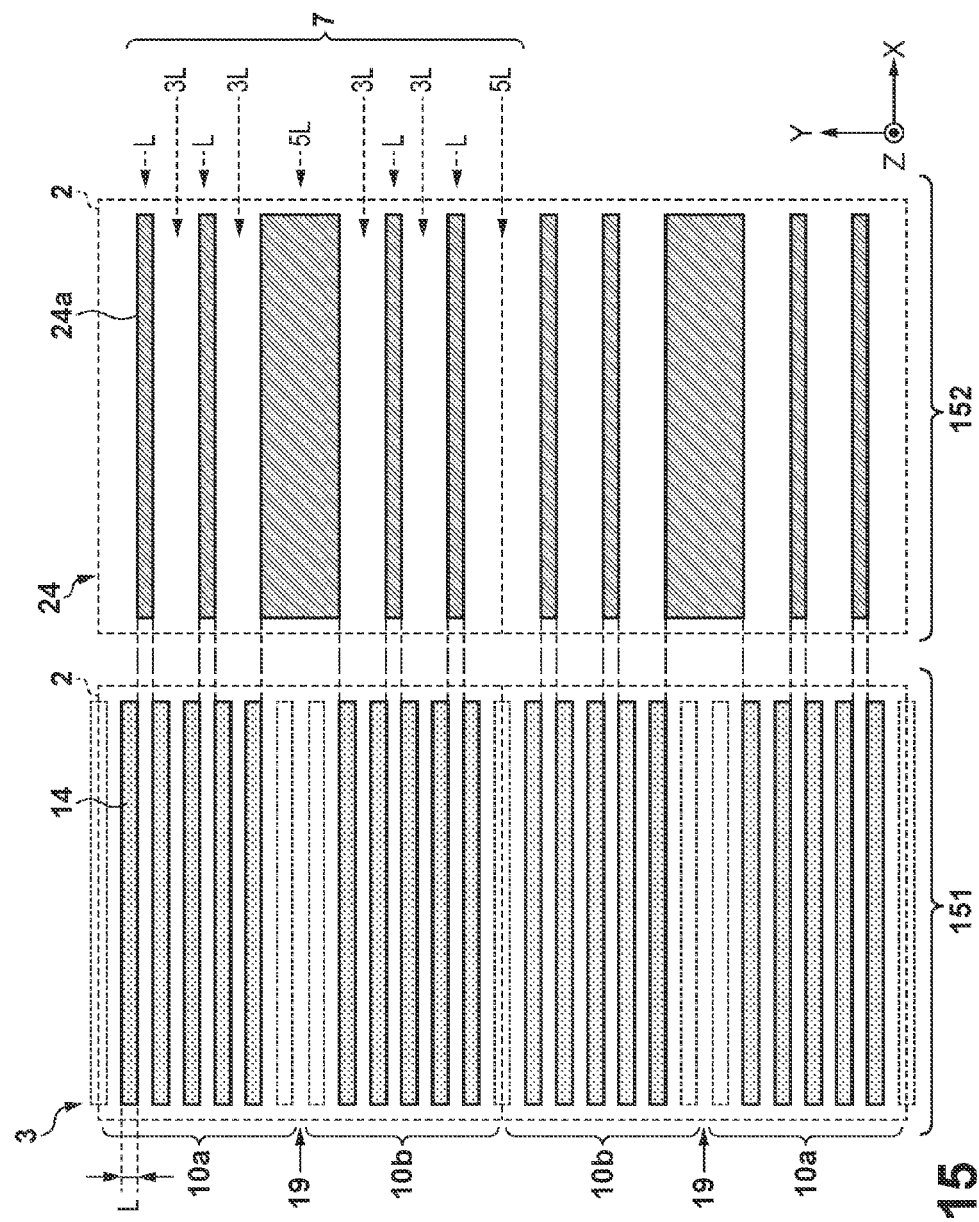
FIG. 15 is a view showing an arrangement example of the fin pattern and the resist pattern.

A left side 151 of FIG. 15 shows the fin pattern 3 having an arrangement in which the five fins 14 are arranged in each of the n-type active region 10a and the p-type active region 10b, and the two fins are excluded at their boundary 19. A right side 152 of FIG. 15 shows the resist pattern 24 formed on the substrate in order to implement the fin pattern 3 shown on the left side 151 of FIG. 15. The resist pattern 24 shown on the right side 152 of FIG. 15 can be made of the line elements 24a each having the same width as the width of each fin 14 and the line elements 24a each having the width which is five times the width of each fin 14. The intervals of the line elements 24a can be configured to be three times and five times the width of the fins 14.

Figure 16:
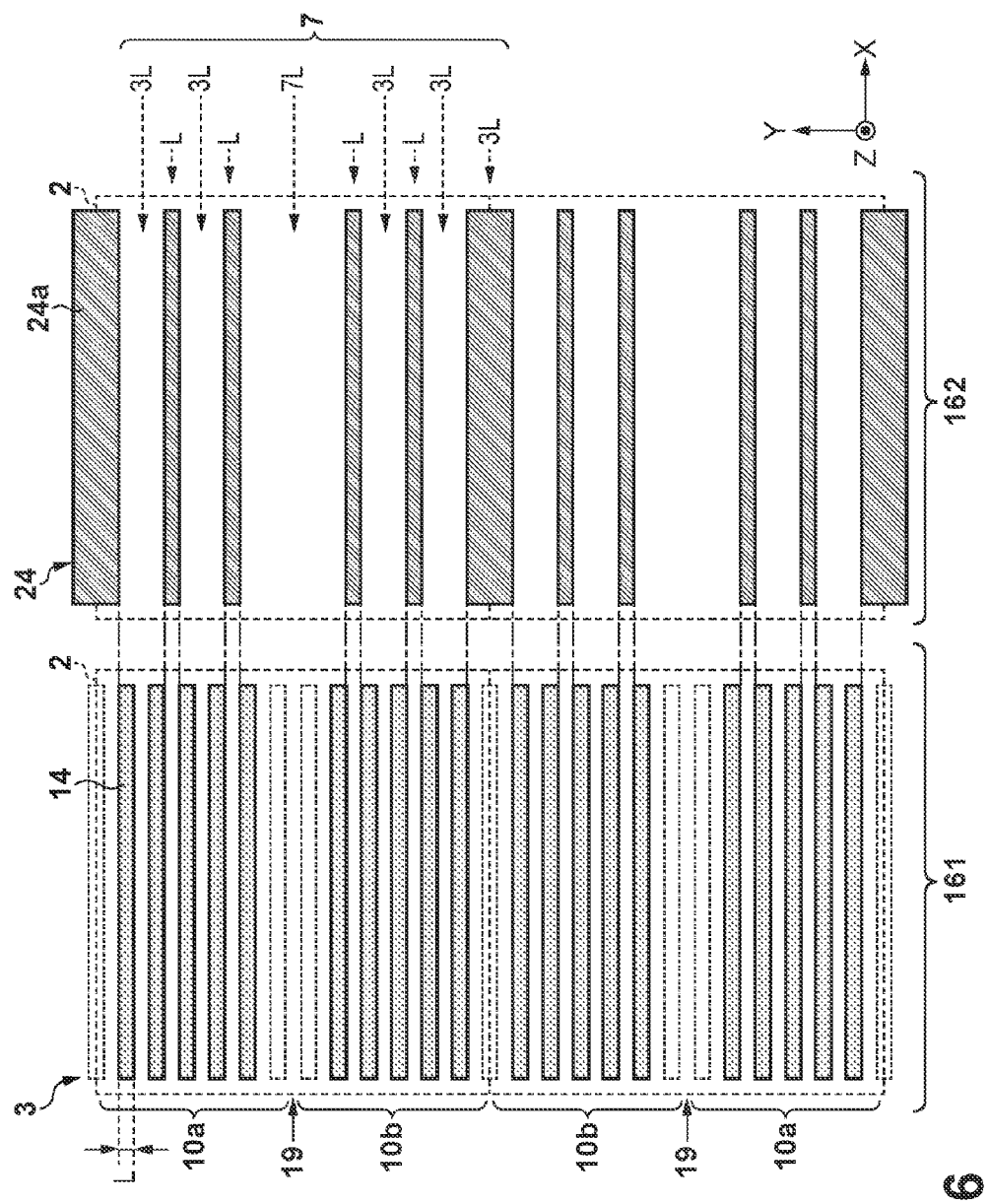
FIG. 16 is a view showing an arrangement example of the fin pattern and the resist pattern.

The fin pattern 3 shown on the left side 151 of FIG. 15 can also be implemented by forming the resist pattern 24 shown on a right side 162 of FIG. 16 on the substrate. The fin pattern 3 shown on a left side 161 of FIG. 16 has the same arrangement as the fin pattern 3 shown on the left side 151 of FIG. 15. The resist pattern 24 shown on the right side 162 of FIG. 16 can be made of the line elements 24a each having the same width as the width of each fin 14 and the line elements 24a each having the width which is three times the width of each fin 14. The intervals of the line elements 24a can be configured to be three times and seven times the width of the fins 14.

Figure 17:
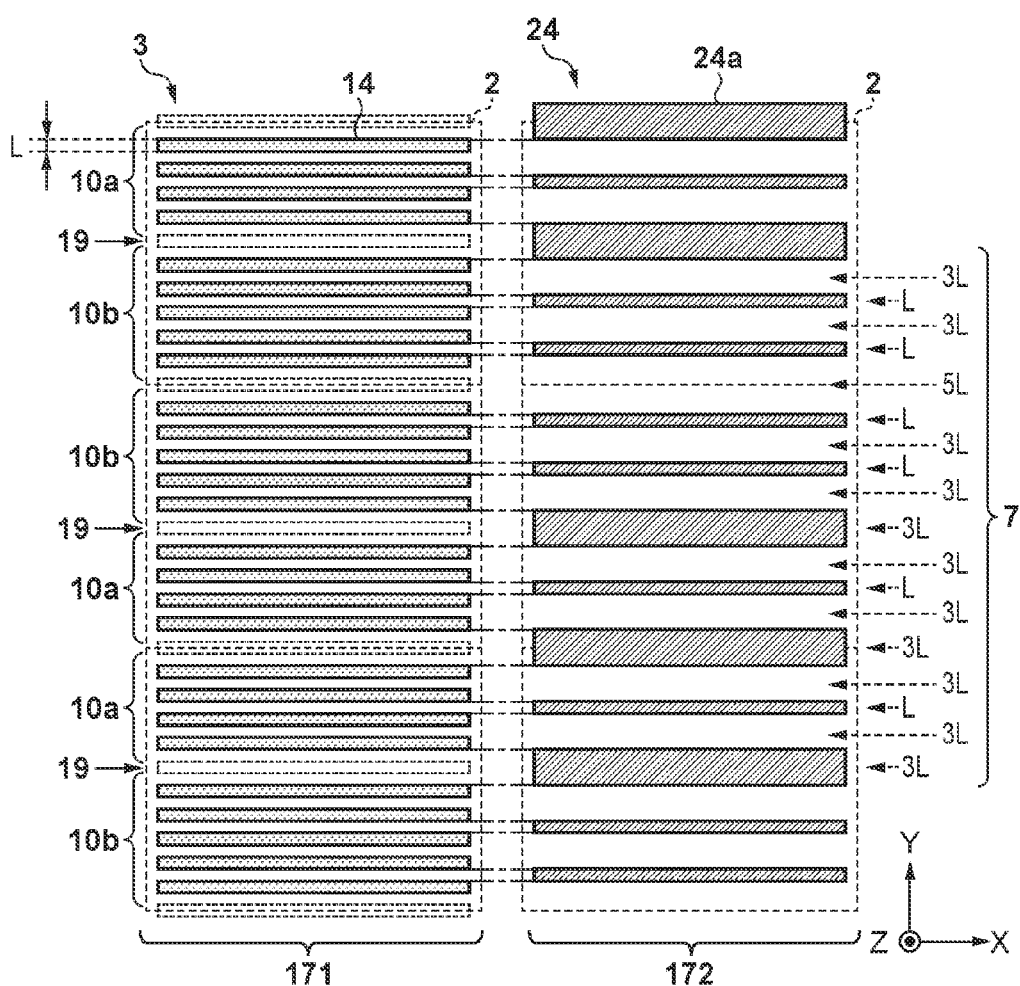
FIG. 17 is a view showing an arrangement example of the fin pattern and the resist pattern.

A left side 171 of FIG. 17 shows the fin pattern 3 having an arrangement in which the four fins 14 for the n-type active region 10a and the five fins 14 for the p-type active region 10b are arranged, and the one fin is excluded at their boundary 19. On the left side 171 of FIG. 17, the two standard cells 2 form the one pattern period 7. A right side 172 of FIG. 17 shows the resist pattern 24 formed on the substrate in order to implement the fin pattern 3 shown on the left side 171 of FIG. 17. The resist pattern 24 shown on the right side 172 of FIG. 17 can be made of the line elements 24a each having the same width as the width of each fin 14 and the line elements 24a each having a width which is three times the width of each fin 14. The intervals of the line elements 24a can be configured to be three times and five times the width of the fins 14.

Figure 18:
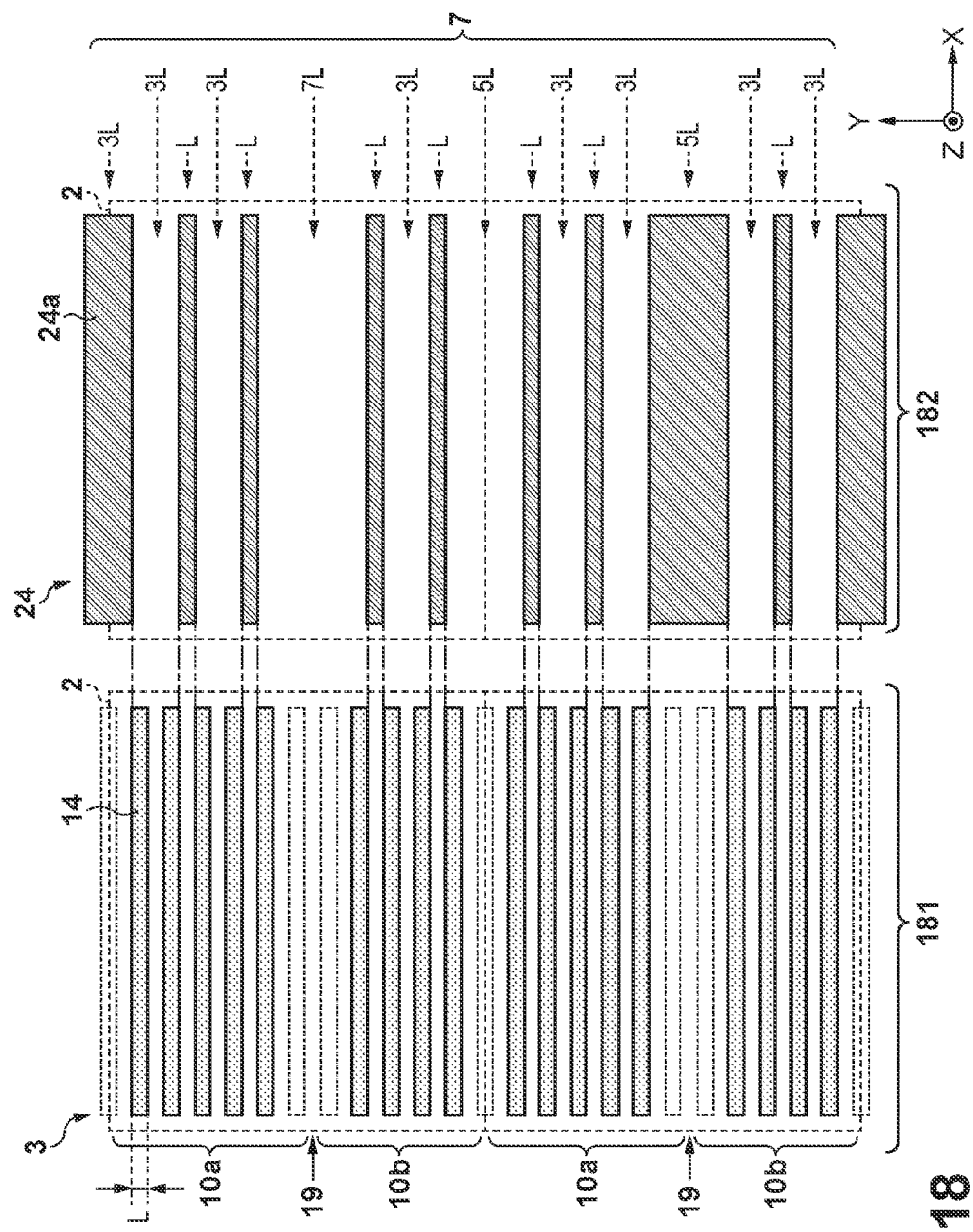
FIG. 18 is a view showing an arrangement example of the fin pattern and the resist pattern.

A left side 181 of FIG. 18 shows the fin pattern 3 having an arrangement in which the five fins for the n-type active region 10a and the four fins for the p-type active region 10b are arranged, and the one fin 14 is excluded at their boundary 19. The left side 181 of FIG. 18 shows an example in which the arrangement of the n-type active region 10a and the p-type active region 10b is not inversed in the two adjacent standard cells 2. A right side 182 of FIG. 18 shows the resist pattern 24 formed on the substrate in order to implement the fin pattern 3 shown on the left side 181 of FIG. 18. The resist pattern 24 shown on the right side 182 of FIG. 18 can be made of the line elements 24a each having the same width as the width of each fin 14, the line elements 24a each having the width which is three times the width of each fin 14, and the line elements 24a each having the width which is five times the width of each fin 14. The intervals of the line elements 24a can be configured to be three times, five times, and seven times the width of the fins 14. Even if the arrangement of the n-type active region 10a and the p-type active region 10b is not thus inversed in the two standard cells 2, the resist pattern 24 can be made of line elements 24a of the plurality of types each having the width of the odd multiple of the width of each fin 14.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-041773 filed on Mar. 3, 2015, which is hereby incorporated by reference herein in its entirety.

What is claimed is:

1. A formation method of forming, on a substrate, a fin pattern in which a plurality of linear fins extending in a first direction are arrayed in a second direction different from the first direction, the method comprising:
   forming a resist pattern having a line-and-space shape on the substrate;
   forming a side wall in each of a plurality of line elements in the resist pattern;
   removing the resist pattern; and
   forming the fin pattern on the substrate by etching the substrate by using the side walls as etching masks,
   wherein the substrate includes a first active region and a second active region adjacent to each other in the second direction and different in a conductivity type, and
   in the forming the resist pattern, the resist pattern is formed on the substrate such that an interval between a first fin and a second fin becomes wider than a pitch of the fins formed in the first active region and a pitch of the fins formed in the second active region, the first fin being closest to a boundary of the first active region and the second active region out of the fins formed in the first active region, and the second fin being closest to the boundary out of the fins formed in the second active region.

2. The method according to claim 1, wherein in the forming the pattern, the resist pattern including a plurality of types of line elements is formed on the substrate, each line element having a width of an odd multiple of the interval of the fins that should be formed in the first active region or the second active region.

3. The method according to claim 2, wherein in the forming the resist pattern, the resist pattern is formed on the substrate such that a width of each line element of the resist pattern for defining the interval between the first fin and the second fin becomes wider than a width of each line element of the resist pattern for defining the interval of the fins that should be formed in the first active region or the second active region.

4. The method according to claim 3, wherein in the forming the resist pattern, the resist pattern is formed on the substrate such that the width of each line element of the resist pattern for defining the interval between the first fin and the second fin becomes n times (n is an odd number not less than three) the width of each line element of the resist pattern for defining the interval of the fins that should be formed in the first active region or the second active region.

5. The method according to claim 2, wherein in the forming the resist pattern, the resist pattern is formed on the substrate such that the width of each line element of the resist pattern for defining the interval of the fins that should be formed in the first active region or the second active region becomes equal to a width of each fin that should be formed on the substrate.

6. The method according to claim 2, wherein in the forming the resist pattern, the resist pattern is formed on the substrate such that the interval of the line elements in the resist pattern becomes m times (m is an odd number not less than three) the width of each fin that should be formed on the substrate.

7. The method according to claim 6, wherein in the forming the resist pattern, the resist pattern is formed on the substrate so as to have a plurality of types of the intervals of the line elements in the resist pattern.

8. The method according to claim 1, wherein in the forming the resist pattern, the resist pattern is formed on the substrate such that each width and each interval of the fins formed in the first active region or the second active region have the same length.

9. The method according to claim 1, wherein in the forming the resist pattern, the resist pattern is formed on the substrate by forming, on the substrate, a provisional resist pattern including a line element having a width larger than each line element of the resist pattern that should be formed on the substrate, and then processing the line element of the provisional resist pattern.

10. The method according to claim 1, wherein in the forming the resist pattern, the resist pattern is formed by performing transfer of a pattern of an original including the plurality of line elements onto the substrate; and
   the pattern of the original is formed, based on a transfer shift by non-periodicity of the pattern of the original, such that each line element is transferred to a target position of the substrate.

* * * * *